(12) United States Patent  
Lim et al.

(10) Patent No.: US 9,807,915 B2  
(45) Date of Patent: Oct. 31, 2017

(54) HEAT EXCHANGER FOR COOLING ELECTRIC ELEMENT

(71) Applicant: Hanon Systems, Daejeon (KR)

(72) Inventors: Hong-Young Lim, Daejeon (KR); Jun Young Song, Daejeon (KR); Youn Woo Lim, Daejeon (KR)

(73) Assignee: HANON SYSTEMS, Daejeon (KR)

(*) Notice: Subject to any disclaimer, the term of this patent is extended or adjusted under 35 U.S.C. 154(b) by 0 days.

(21) Appl. No.: 15/021,322

(22) PCT Filed: Jul. 17, 2014

(86) PCT No.: PCT/KR2014/006494  
§ 371 (c)(1),  
(2) Date: Mar. 11, 2016

(87) PCT Pub. No.: WO2015/037824  
PCT Pub. Date: Mar. 19, 2015

(65) Prior Publication Data  
US 2016/0234975 A1 Aug. 11, 2016

(30) Foreign Application Priority Data

Sep. 12, 2013 (KR) .................. 10-2013-0109663  
May 19, 2014 (KR) .................. 10-2014-0059515  
May 19, 2014 (KR) .................. 10-2014-0059646

(51) Int. Cl.  
*H01L 23/367* (2006.01)  
*H05K 7/20* (2006.01)  
(Continued)

(52) U.S. Cl.  
CPC ..... *H05K 7/20927* (2013.01); *H01L 23/3675* (2013.01); *H01L 23/46* (2013.01);  
(Continued)

(58) Field of Classification Search  
CPC ...................... H05K 7/20927; H01L 23/3675  
(Continued)

(56) References Cited

U.S. PATENT DOCUMENTS 3,921,201 A * 11/1975 Eisele .................. H01L 23/427  
165/80.4  
5,363,910 A * 11/1994 Baba .................. F28D 1/05366  
165/153  
(Continued)

FOREIGN PATENT DOCUMENTS

JP 2001245478 A 9/2001  
JP 2008271770 A 11/2008  
JP 2008294283 A 12/2008

*Primary Examiner* — Dion R Ferguson  
*Assistant Examiner* — Mandeep S Buttar  
(74) *Attorney, Agent, or Firm* — Shumaker, Loop & Kendrick, LLP; James D. Miller

(57) ABSTRACT

Provided are a heat exchanger for cooling an electric element and a heat exchanger assembly for cooling an electric element, and more particularly, a heat exchanger for cooling an electric element and a heat exchanger assembly for cooling an electric element capable of facilitating an insertion of the electric element and improving cooling performance by contacting both side surfaces of the electric element and a tube in which cooling water flows to each other.

18 Claims, 16 Drawing Sheets

(51) Int. Cl.
*H01L 23/46* (2006.01)
*H01L 23/473* (2006.01)

(52) U.S. Cl.
CPC ....... *H01L 23/473* (2013.01); *H05K 7/20254* (2013.01); *H01L 2924/0002* (2013.01)

(58) Field of Classification Search
USPC .......................................... 361/696, 679.52
See application file for complete search history.

(56) References Cited

U.S. PATENT DOCUMENTS

| | | | |
|---|---|---|---|
| 7,656,016 B2* | 2/2010 | Yoshimatsu | .......... H01L 25/112 |
| | | | 165/80.4 |
| 2001/0033477 A1 | 10/2001 | Inoue et al. | |
| 2003/0151892 A1* | 8/2003 | Kondo | .................... G06F 1/203 |
| | | | 361/679.53 |
| 2007/0084585 A1 | 4/2007 | Takagi et al. | |
| 2008/0239663 A1* | 10/2008 | Yamamoto | ............ H01L 23/473 |
| | | | 361/691 |
| 2009/0059526 A1 | 3/2009 | Wu | |
| 2009/0294114 A1 | 12/2009 | Yang et al. | |
| 2011/0100614 A1* | 5/2011 | Oh | ...................... F28D 1/05391 |
| | | | 165/173 |
| 2014/0020425 A1* | 1/2014 | Hirayama | ................ F25B 39/02 |
| | | | 62/515 |

* cited by examiner

FIG. 1 – PRIOR ART

HEAT EXCHANGER FOR COOLING ELECTRIC ELEMENT

CROSS-REFERENCES TO RELATED APPLICATIONS

This patent application is a United States national phase patent application based on PCT/KR2014/006494 filed Jul. 17, 2014 which claims the benefit of Korean Patent Application No. 10-2013-0109663 filed Sep. 12, 2013, Korean Patent Application No. 10-2014-0059515 filed May 19, 2014, and Korean Patent Application No. 10-2014-0059646 filed May 19, 2014. The entire disclosures of the above patent applications are hereby incorporated herein by reference.

TECHNICAL FIELD

The present invention relates to a heat exchanger for cooling an electric element and a heat exchanger assembly for cooling an electric element, and more particularly, to a heat exchanger for cooling an electric element and a heat exchanger assembly for cooling an electric element capable of facilitating an insertion of the electric element and improving cooling performance by contacting both side surfaces of the electric element and a tube in which cooling water flows to each other.

BACKGROUND OF THE INVENTION

As a part of environmental pollution measures, the development of a hybrid vehicle using a torque of a motor, a fuel cell vehicle, an electric vehicle, and so on has recently been in the limelight. The vehicles as described above are generally equipped with a power control unit (PCU) controlling power supplied from a driving battery (for example, voltage of 300 V) to be supplied to a motor in a desired state.

The PCU includes electric elements such as an inverter, a smoothing condenser, and a converter. If the electric elements are supplied with electricity, the electric elements generate heat. Therefore, the electric elements have to include a separate cooler.

As the relevant technologies, Japanese Patent Laid-Open Publication No. 2001-245478 (Published On Sep. 7, 2001, Title: Cooler for inverter) discloses an inverter using a semiconductor module having semiconductor devices of IGBT, etc. and a diode embedded therein and Japanese Patent Laid-Open Publication No. 2008-294283 (Published on Dec. 4, 2008, Title: Semiconductor Device) discloses a heat sink installed to contact a lower side surface of a semiconductor device and having a fluid flowing therein to exchange heat.

The single side cooling scheme has a limit of cooling performance. To improve the above problem, a dual side cooling scheme is devised. The dual side cooling scheme has a structure in which an element is inserted into a space between heat exchangers, and therefore the dual side cooling scheme needs to satisfy the conditions that an insertion interval of the electric element of the heat exchanger needs to be higher than a height of the electric element and the electric element and the heat exchanger need to be compressed to each other well to increase heat transfer performance of the heat exchanger.

As illustrated in FIG. 1, the heat exchanger based on the dual side cooling scheme may be configured to include tubes 20 positioned on both side surfaces of the electric element 10 and having a heat exchange medium flowing therein and tanks 30 coupled with both ends of the tubes and having the heat exchange medium introduced thereinto or discharged therefrom. However, the heat exchanger is coupled by brazing to fix the insertion space of the electric element and then insert the electric element, and therefore it has the disadvantage in that it is difficult to perform the insertion operation of the electric element.

Further, if the interval between the tubes is wide to facilitate the insertion of the electric element, the heat exchanger has a disadvantage in that the electric element and the tube are not compressed to each other well and thus the heat exchange efficiency is reduced.

Therefore, there is a need to develop a heat exchanger for cooling an electric element capable of facilitating the insertion of the electric element and compressing the electric element and the heat exchanger to each other well.

SUMMARY OF THE INVENTION

An object of the present invention is to provide a heat exchanger for cooling an electric element having improved cooling performance and assembling performance by including tubes having a portion bent to contact both side surfaces of the electric element in a height direction of the electric element to facilitate an insertion of the electric element, easily be compressed to the electric element, and contact both side surfaces of the electric element and the tubes in which cooling water flows to each other.

Another object of the present invention is to provide a heat exchanger for cooling an electric element capable of having improved cooling capacity and performance by including tubes that are disposed in two rows and extended in a length direction, bent in an opposite direction to each other at at least two points to be stacked in a multi-stage, and have a heat exchange medium flowing therein to contact both side surfaces of the electric element stacked in the multi-stage and the tubes in which cooling water flows to each other.

In one general aspect, a heat exchanger 1 for cooling an electric element includes: tubes 100 extended in a length direction, bent based on a predetermined point to contact both side surfaces of the electric element in a height direction of the electric element, and having a heat exchange medium flowing therein; a first header tank 210 coupled and fixed to one end portion of the tube 100 in the length direction of the tube 100 and introduced with the heat exchange medium; a second header tank 220 coupled and fixed to the other end portion of the tube 100 in the length direction of the tube 100 and discharging the heat exchange medium; and an inlet pipe 310 and an outlet pipe 320 formed in the first header tank 210 and the second header tank 220 to be introduced with the heat exchange medium and discharge the heat exchange medium, respectively.

The tube 100 may be bent once based on a predetermined point to be coupled and fixed to contact both side surfaces of the electric element in the height direction of the electric element disposed in a portion of an upper side surface of the tube 100.

The tube 100 may be bent in a state in which both ends of the tube 100 are coupled with the first header tank 210 and the second header tank 220 by brazing and the first header tank 210 and the second header tank 220 may be disposed at the same position in the height direction.

The first header tank 210 may be provided with the inlet pipe 310, the second header tank 220 may be provided with the outlet pipe 320, and the inlet pipe 310 and the outlet pipe 320 may be formed to be spaced apart from each other at a predetermined distance in an opposite direction to each other based on a central line in a width direction of the first header tank 210 and the second header tank 220.

The tubes 100 having both ends coupled with the first header tank 210 and the second header tank 220 may be coupled with the first header tank 210 and the second header tank 220 while being biased from centers of the first header tank 210 and the second header tank 220 in the height direction.

The tube 100 may be formed in plural while being spaced apart from each other at a predetermined distance in a width direction thereof.

The heat exchanger 1 for cooling an electric element may further include: a gap formed by allowing the tubes 100 to be spaced apart from each other at a predetermined distance in the width direction thereof, wherein the gap is formed to be at least two times longer than a length of an element fixing part 21 protruding at one side surface of the electric element in the width direction of the electric element.

The tubes 100 may be disposed in two rows to be extended in a length direction, may be bent in an opposite direction to each other at at least two points to be stacked in a multi-stage, and may have a heat exchange medium flowing therein.

The electric element 2 may be inserted between the tubes 100 stacked in the multi-stage to contact both side surfaces of the electric element 2 and the tubes 100 to each other and both of upper and lower side surfaces of at least one tube 100 among the tubes 100 in the multi-stage may contact the electric element 2.

The first header tank 210 may be provided with the inlet pipe 310 and the outlet pipe 320.

In the first header tank 210, a 1-1-th header tank 211 that is a part connected to the tube 100 of a first row and a 1-2-th header tank 212 that is a part connected to the tube 100 of a second row may be separated from each other and any one of the 1-1-th header tank 211 and the 1-2-th header tank 212 may be provided with the inlet pipe 310 and the other thereof may be provided with the outlet pipe 320.

In the first header tank 210, a part connected to the tube 100 of a first row and a part connected to the tube 100 of a second row may have a baffle provided therebetween to be separated from each other and one of the separated areas may be provided with the inlet pipe 310 and the other thereof may be provided with the outlet pipe 320.

The tubes 100 may include a rounded part 110 whose bent point protrudes outward to make a height of the bent point be higher than an interval between the tubes 100 of a point where the electric element 2 is seated.

The heat exchanger 1 for cooling an electric element may further include: a clip coupling part 120 formed by pressing a portion of the tubes 100 positioned at both end portions of the electric element in the length direction of the electric element to the electric element.

A width Tw of the tube 100 may be formed to be equal to or smaller than a width Cw of the electric element.

In another general aspect, there is provided a heat exchanger assembly 3 for cooling an electric element of the heat exchanger 1 for cooling an electric element and the electric element 2 as described above, wherein the electric element may be assembled to allow both sides surfaces to contact the tube 100 in the height direction.

When the tube 100 is one row, a connector 22 of the electric element may be disposed at one side surface of the tube 100 in a width direction of the tube 100 and the electric element may be assembled by being inserted between the tubes 100 so that an element fixing part 21 of the electric element is disposed at the other side surface of the tube 100 in a width direction of the tube 100.

When the tube 100 is two row, the element fixing part 21 of the electric element may be disposed in an inside space formed by allowing the adjacent tubes 100 to be spaced apart from each other and the connector 22 of the electric element may be disposed in an outside space.

The electric element may be inserted and then compressed to the tube 100, in a state in which the tube 100 is bent at a predetermined angle so that both end portions of the tube 100 coupled with a first header tank 210 and a second header tank 220 are spaced apart from each other.

When the tube 100 is bent at two points, the electric element 2 may be disposed at a two-row two-stage.

As set forth above, according to the exemplary embodiment of the present invention, the heat exchanger for cooling an electric element may efficiently cool the heat generated from the integrated circuit element by contacting both side surfaces of the electric element and the tubes in which the cooling water flows to each other.

Further, the heat exchanger for cooling an electric element in accordance with the exemplary embodiment of the present invention may improve the cooling performance and the assembling performance by including the tubes having a portion bent to contact both side surfaces of the electric element in the height direction of the electric element to facilitate the insertion of the electric element and be easily compressed to the electric element.

Further, the heat exchanger for cooling an electric element in accordance with the exemplary embodiment of the present invention may improve the cooling capacity and the cooling performance by including the tubes bent in the opposite direction to each other at at least two points to contact both side surfaces of the electric element in the height direction of the electric element to be stacked in the multi-stage to contact both side surfaces of the electric element stacked in the multi-stage and the tubes in which the cooling water flows to each other.

In other words, if the interval between the tubes is wide to easily insert the electric element in the heat exchanger based on the existing dual side cooling scheme, it is difficult to compress the electric element and the tubes to each other, but on the contrary, if the interval between the tubes is narrow to compress the electric element and the tubes to each other, to solve the problem in that it is difficult to insert the electric element, the present invention may dispose the electric element in the space between the tubes bent at a predetermined angle without the process of inserting the electric element into the narrow gap and then compress the tubes and the electric element to each other, thereby improving the cooling performance and the assembling performance.

In this case, according to the present invention, the rounded part of the bent point protrudes outward to prevent the tube from being damaged during the process of bending the tubes to contact both surfaces of the electric element having the thickness of about 4 to 5 mm.

Further, the present invention may include the clip coupling part depressed by pressing a portion of the tubes positioned at both end portions of the electric element in the length direction of the electric element to the electric element side, thereby stably compressing the electric element.

Further, the present invention may configure the inlet and outlet pipes in the same direction to simplify the channel structure and reduce the space occupied within the vehicle, thereby easily disposing the surrounding components.

In particular, according to the present invention, when the tubes are bent in the two rows multi-stage, if one of the header tanks coupled and fixed to both ends of the tubes is formed in the separated type or the baffle is disposed in the space between the two-row tubes and the other header tanks are formed in the integrated type, the inlet and outlet pipes may be configured in the same direction to simplify the channel configuration and reduce the space occupied within the vehicle, thereby easily disposing the surrounding components.

Further, when the header tanks are formed in the separated type, the electric elements may be assembled row by row, such that the deformation possibility of the heat exchanger may be reduced and the assembling may be more convenient.

DETAILED DESCRIPTION OF THE INVENTION

Figure 1:
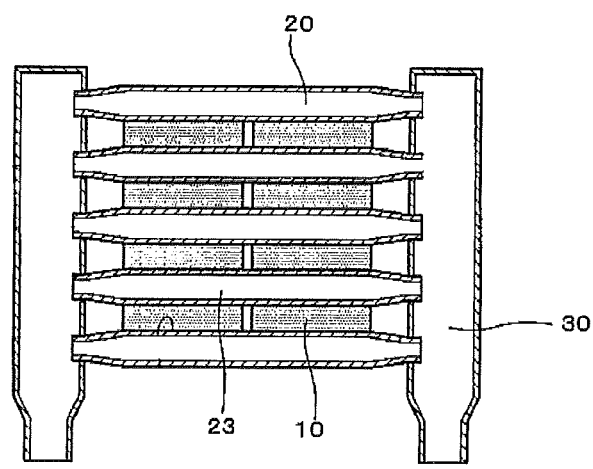
FIG. 1 is a side view illustrating an example of the existing cooler for an electric element.

Hereinafter, a heat exchanger for cooling an electric element and a heat exchanger assembly for cooling an electric element according to the present invention will be described in detail with reference to the accompanying drawings.

The present invention relates to a heat exchanger 1 for cooling an electric element based on a dual side cooling scheme which is formed by contacting both side surfaces of the electric element, in which the heat exchanger 1 for cooling an electric element is configured to largely include a tube 100, a first header tank 210, and a second header tank 220.

Here, the electric element may be any one of an inverter for a vehicle, a motor driving inverter, and an air conditioner inverter using a semiconductor module having a semiconductor device of IGBT, etc., and a diode embedded therein. The present invention relates to the heat exchanger 1 for cooling an electric element.

The tubes 100 are extended in a length direction, bent based on a predetermined point to contact both side surfaces of the electric element in a height direction of the electric element, and have a heat exchange medium flowing therein and may be formed as illustrated in FIGS. 2 to 4 or FIGS. 13 and 14.

The heat exchange medium flowing in the tube 100 may be water with which ethylene glycol-based antifreeze is mixed, a natural refrigerant such as water and ammonia, or a Freon-based refrigerant such as R134a, an alcohol-based refrigerant, and a ketone-based refrigerant such as acetone.

The tube 100 may be a tube 100 manufactured by a scheme of extruding a plurality of partition walls in a length direction therein and may be a tube 100 manufactured by a folding scheme or a tube 100 manufactured by a welding scheme.

Figure 2:
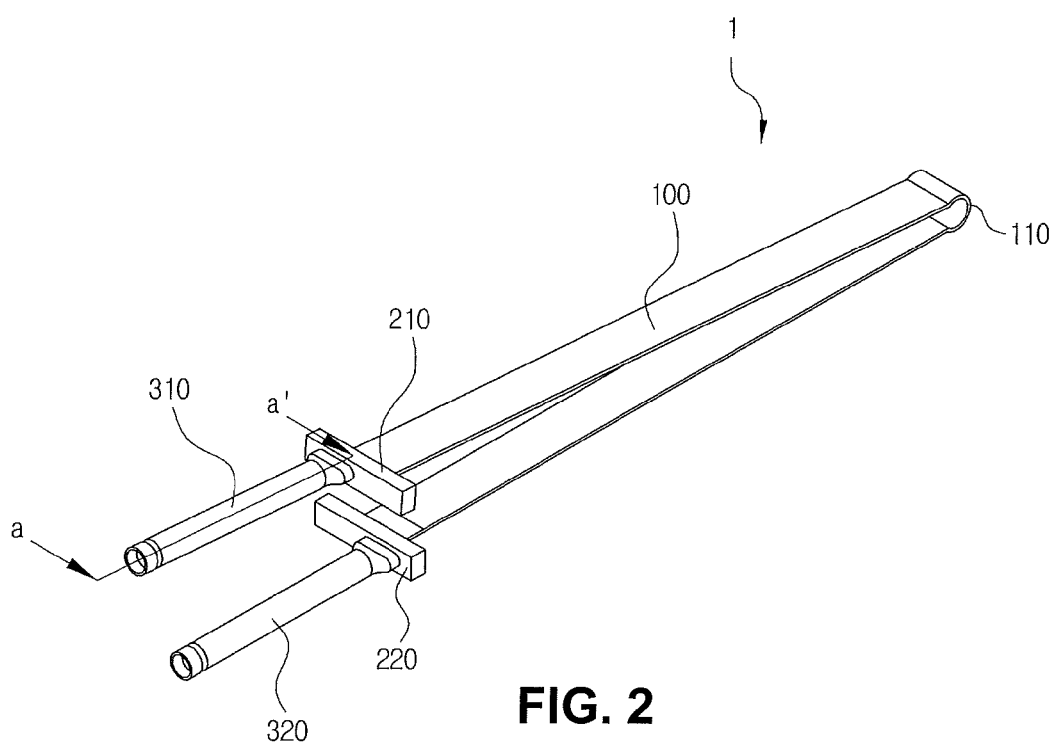
FIG. 2 is a perspective view illustrating a heat exchanger for cooling an electric element according to an exemplary embodiment of the present invention.
Figure 3:
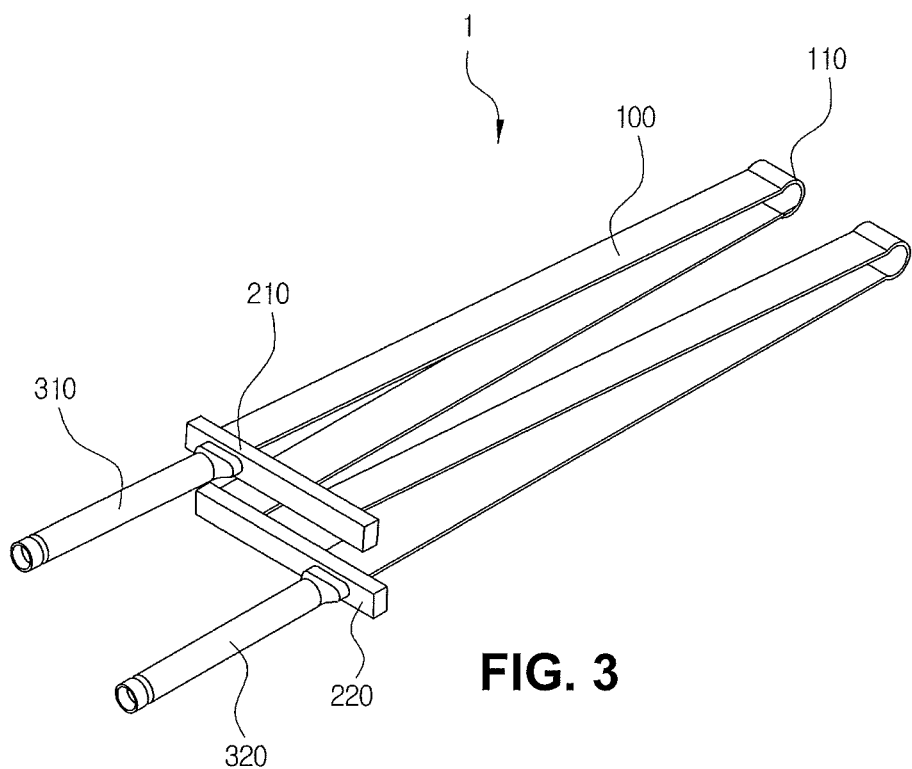
FIG. 3 is a perspective view illustrating a heat exchanger for cooling an electric element according to another exemplary embodiment of the present invention.
Figure 4:
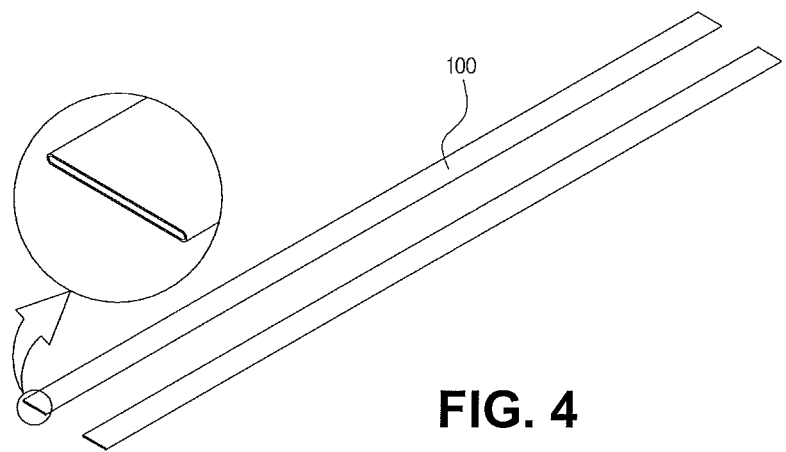
FIG. 4 is a perspective view illustrating a state before a tube of the heat exchanger for cooling an electric element is bent of FIG. 3.

First, describing the heat exchanger 1 for cooling an electric element illustrated in FIGS. 2 to 4, the first header tank 210 is coupled and fixed to one end portion of the tube 100 in a length direction of the tube 100 and is provided with an inlet pipe 310 through which the heat exchange medium may be introduced.

The second header tank 220 is coupled and fixed to the other end portion of the tube 100 in the length direction of the tube 100 and is provided with an outlet pipe 320 through which the heat exchange medium may be discharged.

That is, in the heat exchanger 1 for cooling an electric element according to the present invention, the first header tank 210 and the second header tank 220 are coupled and fixed to both ends of the tube 100 before the tube 100 is bent as illustrated in FIG. 4 and thus the first header tank 210 and the second header tank 220 are spaced apart from each other at a predetermined distance in parallel in a length direction.

Next, as illustrated in FIGS. 2 and 3, in the heat exchanger 1 for cooling an electric element according to the present invention, the tube 100 is bent based on a predetermined point so that the tubes 100 contact both side surfaces of the electric element in a height direction of the electric element disposed in a portion of an upper side surface of the tube 100.

In the heat exchanger 1 for cooling an electric element according to the present invention, the tube 100 is bent in a state in which the first header tank 210 and the second header tank 220 are coupled with both ends of the tube 100 by brazing, and thus the first header tank 210 and the second header tank 220 are disposed at the same position in the height direction.

In other words, in the heat exchanger 1 for cooling an electric element according to the present invention, the tubes 100 are bent based on a central portion of the tube 100 in the length direction of the tube 100 to allow the first header tank 210 and the second header tank 220 to be positioned in parallel in the height direction, such that one side surface of the first header tank 210 and one side surface of the second header tank 220 may contact each other and the inlet pipe 310 and the outlet pipe 320 may be formed in the same direction.

In this case, when the heat exchanger 1 for cooling an electric element is assembled with the electric element, the electric element is inserted between the bent tubes 100. In this case, a distance between the tubes 100 is only 4 to 5 mm in the state in which the tube 100 is completely bent to adhere the both side surfaces of the electric element and the tube 100.

To set the distance between the bent tubes 100 to be about 4 to 5 mm, a fatigue applied to the bent point cannot but be large. To minimize it, the tube 100 may include a rounded part 110 whose bent point protrudes outward so that a height of the bent point may be higher than an interval between the tubes 100 at a point where the electric element is seated.

Figure 5:
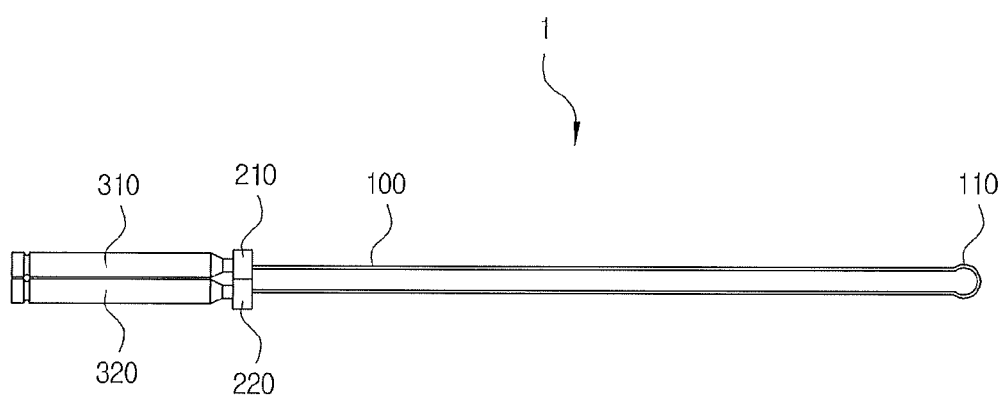
FIG. 5 is a side view illustrating the heat exchanger for cooling an electric element according to the exemplary embodiment of the present invention.

As illustrated in FIG. 5, the rounded part 110 is formed at the bent point and a cross section thereof may be formed in a circular shape in which a portion of one side is open.

In the heat exchanger 1 for cooling an electric element according to the exemplary embodiment of the present invention, a diameter of the inlet pipe 310 and the outlet pipe 320 may be formed to be larger than the height of the first header tank 210 and the second header tank 220. In this case, if the central portions of the first header tank 210 and the second header tank 220 are provided with the inlet pipe 310 and the outlet pipe 320, the tube 100 is bent and thus when the first header tank 210 and the second header tank 220 are positioned in parallel in the height direction, a mutual interference cannot but occur.

Therefore, as illustrated in FIG. 2, when the tube 100 is formed in one row, in the heat exchanger 1 for cooling an electric element according to the exemplary embodiment of the present invention, the inlet pipe 310 formed at the first header tank 210 and the outlet pipe 320 formed at the second header tank 220 may be disposed to cross each other in a width direction thereof.

That is, the inlet pipe 310 and the outlet pipe 320 are installed to be spaced apart from each other at a predetermined distance based on a central line in the width direction of the tube 100.

Further, in the heat exchanger 1 for cooling an electric element according to the exemplary embodiment of the present invention, to contact both side surfaces of the electric element and the tube 100 to each other, the interval between the tubes 100 in the final shape of the tube 100 that is in a completely bent state coincides with the height of the electric element, which also coincides with the height of the portion where the first header tank 210 and the second header tank 220 are bonded to each other by brazing.

Therefore, in the heat exchanger 1 for cooling an electric element according to the exemplary embodiment of the present invention, the tubes 100 having both end portions coupled with the first header tank 210 and the second header tank 220 are coupled with the first header tank 210 and the second header tank 220 while being biased inwardly from the centers of the first header tank 210 and the second header tank 220 in the height direction. That is, the central line in the height direction of the inlet pipe 310 and the outlet pipe 320 does not coincide with the central line of the tube 100.

Meanwhile, FIGS. 3 and 4 illustrate the heat exchanger for cooling an electric element having the two-row tube 100. In this case, while the inlet pipe 310 and the outlet pipe 320 are spaced apart from each other at a predetermined distance based on the central line in the width direction of the first header tank 210 and the second header tank 220 and when the inlet pipe 310 and the outlet pipe 320 are asymmetrical to each other, a difference between a pressure drop amount of an internal fluid passing through the tube 100 of a first row and a pressure drop amount of an internal fluid passing through the tube 100 of a second row occurs due to the positions of the inlet pipe 310 and the outlet pipe 320, and thus a distribution of a flow rate between the tubes 100 may be non-uniform, such that the inlet pipe 310 and the outlet pipe 320 may be installed to be spaced apart from each other at a predetermined distance while being symmetrical to each other based on the central line in the width direction of the first header tank 210 and the second header tank 220.

Figure 7:
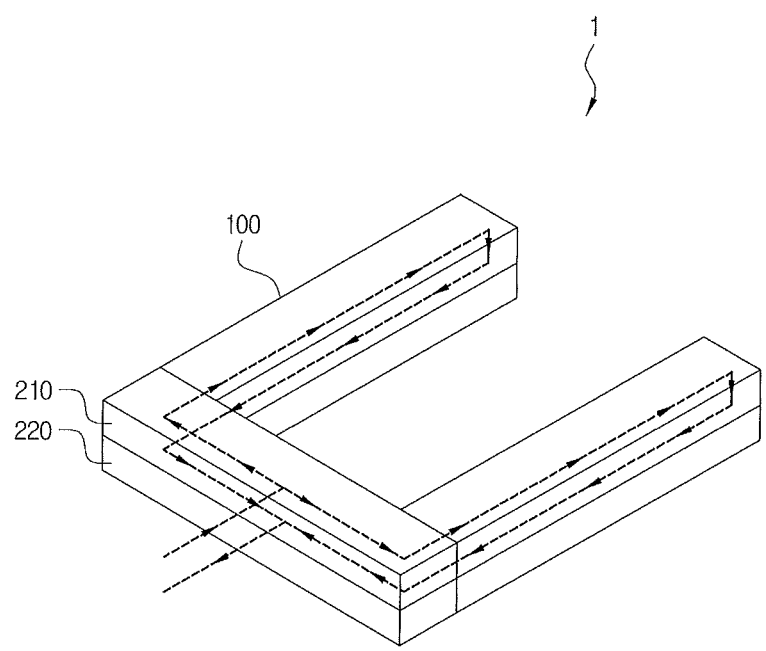
FIG. 7 is a diagram illustrating a flow of a heat exchange medium of the heat exchanger for cooling an electric element of FIG. 3.

The flow of the heat exchange medium in the heat exchanger 1 for cooling an electric element according to the exemplary embodiment of the present invention will be described with reference to FIG. 7.

First, the heat exchange medium introduced through the inlet pipe 310 communicating with the first header tank 210 passes through the first header tank 210 and then flows along the tube 100 adhering to the upper side surface of the electric element.

Next, the heat exchange medium flows along the tube 100 adhering to the lower side surface of the electric element and then passes through the second header tank 220 to be discharged to the outlet pipe 320.

Figure 13:
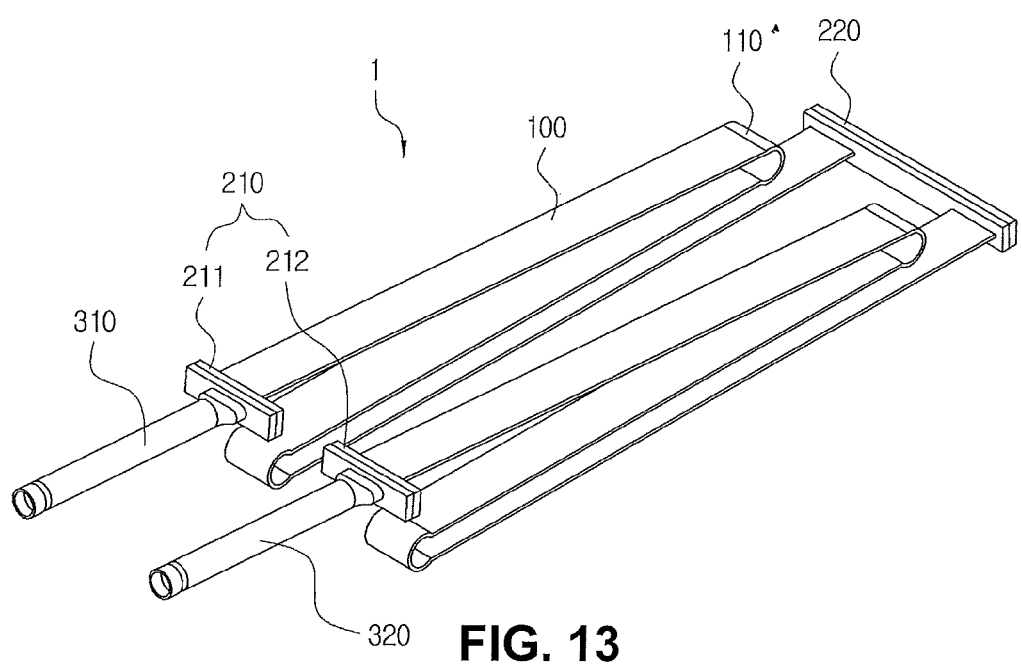
FIG. 13 is a perspective view illustrating a heat exchanger for cooling an electric element according to another exemplary embodiment of the present invention.
Figure 14:
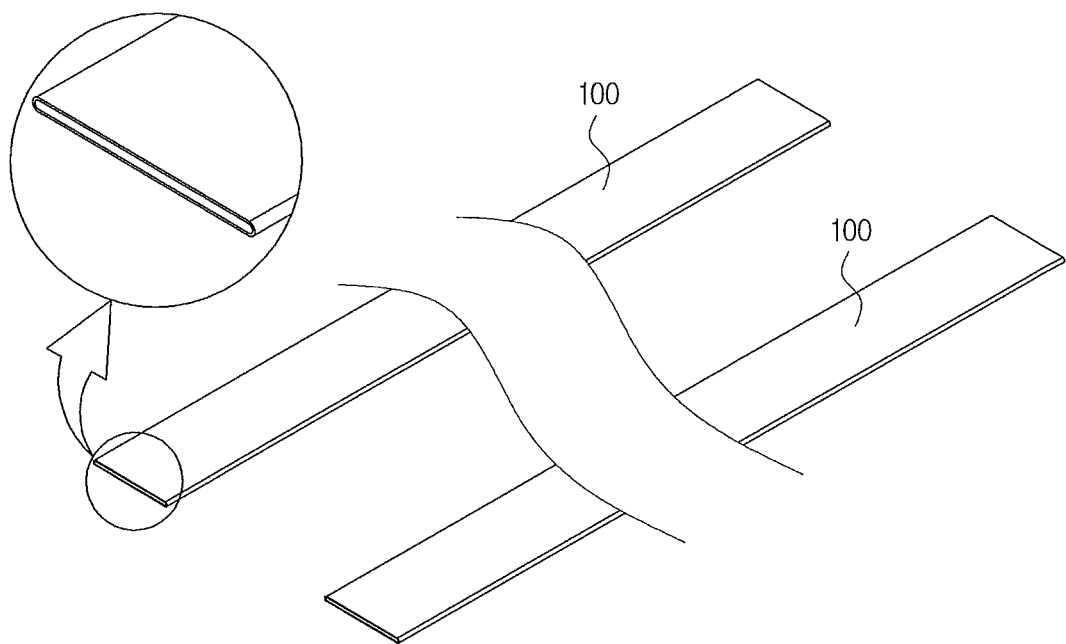
FIG. 14 is a perspective view illustrating a state before a tube of the heat exchanger for cooling an electric element of FIG. 13 is bent.
Figure 15:
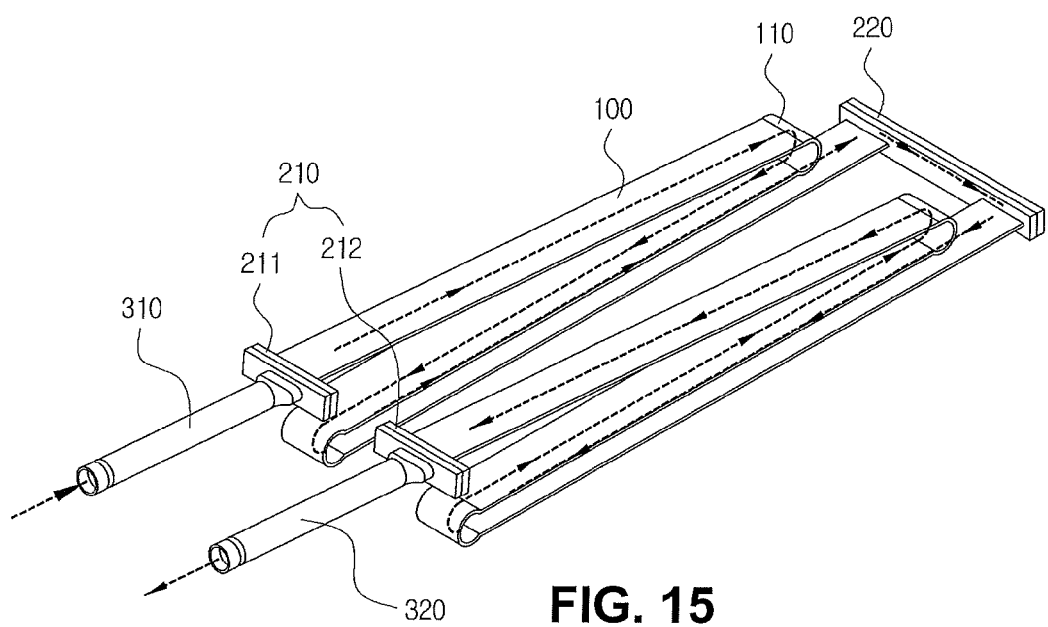
FIG. 15 is a diagram illustrating a flow of a heat exchange medium in the heat exchanger for cooling an electric element of FIG. 13.

In a heat exchanger for cooling an electric element according to another exemplary embodiment of the present invention, as illustrated in FIG. 13, the tubes 100 are disposed in two rows while being spaced apart from each other at a predetermined distance and bent in an opposite direction to each other at at least two points to be stacked in a multi-stage, such that the tube 100 may have a zigzag shape.

In this case, when the tube 100 is bent at two points, the bent point becomes approximately ⅓ and ⅔ points of a total length, and thus total lengths of each stage may be equal to each other.

That is, if the tube 100 has N bent points, the bent point may be a point that is 1/(N−1), 2/(N−1) . . . N/(N−1) of the total length of the tube 100.

Therefore, in the heat exchanger 1 for cooling an electric element according to the exemplary embodiment of the present invention, the electric element 2 is inserted between the tubes 100 stacked in the multi-stage and thus both side surfaces of the electric element 2 contact the tube 100 and both of the upper and lower side surfaces of at least any one of the tubes 100 of the multi-stage contact the electric element 2.

In the heat exchanger 1 for cooling an electric element according to the exemplary embodiment of the present invention as illustrated in FIG. 13, the tube 100 positioned at a middle portion in the height direction contacts the electric elements 2 that are positioned at upper and lower portions.

In this case, like the heat exchanger 1 for cooling an electric element of FIGS. 2 and 3, in the heat exchanger 1 for cooling an electric element according to the exemplary embodiment of the present invention, to set the distance between the bent tubes 100 to be about 4 to 5 mm, a fatigue applied to the bent point cannot but be large. To minimize it, the tube 100 may include a rounded part 110 whose bent point protrudes outward so that a height of the bent point may be higher than an interval between the tubes 100 at a point where the electric element 2 is seated.

Further, in the heat exchanger 1 for cooling an electric element according to the exemplary embodiment of the present invention illustrated in FIG. 13, the first header tank 210 is coupled and fixed to an end portion of one side in the length direction of the tube 100 and the first header tank 210 is provided with the inlet pipe 310 and the outlet pipe 320, such that the heat exchange medium may be introduced and discharged.

In this case, as illustrated in FIG. 13, in the first header tank 210, a 1-1-th header tank 211 that is a part connected to the tube 100 of the first row and a 1-2-th header tank 212 that is a part connected to the tube 100 of the second row are separated from each other and any one of the 1-1-th header tank 211 and the 1-2-th header tank 212 may be provided with the inlet pipe 310 and the other may be provided with the outlet pipe 320.

In this case, the heat exchanger 1 for cooling an electric element according to the exemplary embodiment of the present invention has an advantage in that the electric element may be assembled row by row and thus the deformation possibility of the heat exchanger may be reduced and the assembling may be more convenient.

Figure 16:
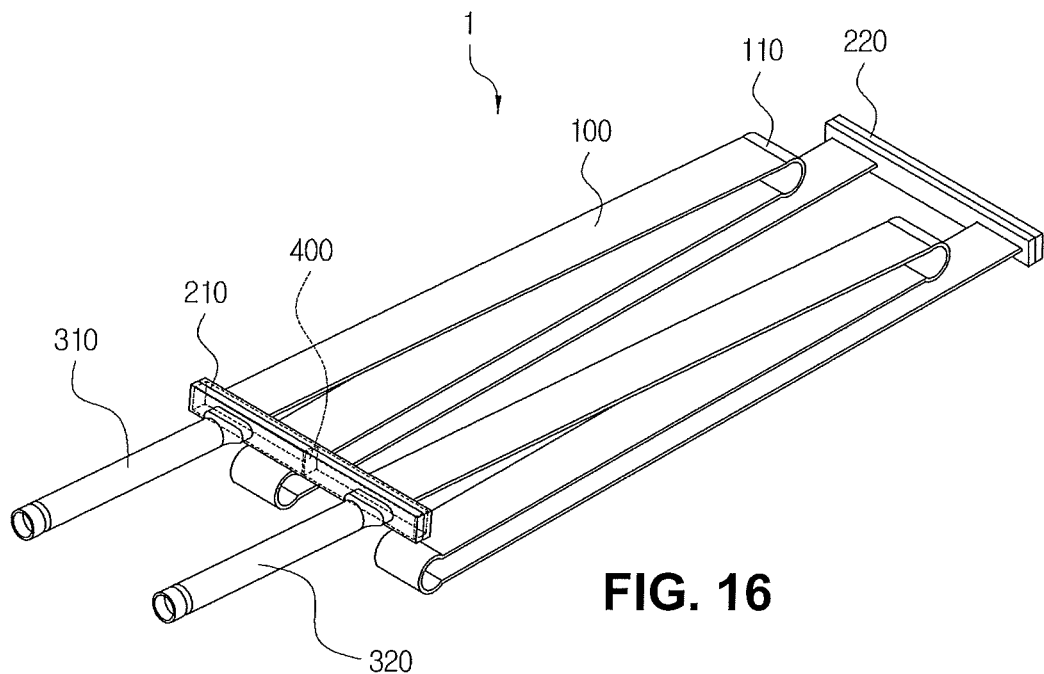
FIG. 16 is a perspective view illustrating a heat exchanger for cooling an electric element according to another exemplary embodiment of the present invention.

According to another exemplary embodiment of the present invention, as illustrated in FIG. 16, the first header tank 210 is integrally formed but the part connected to the tube 100 of the first row and the part connected to the tube 100 of the second row have a baffle 400 provided therebetween to be separated from each other and one of the separated areas may be provided with the inlet pipe 310 and the other thereof may be provided with the outlet pipe 320.

The heat exchanger 1 for cooling an electric element illustrated in FIGS. 13 and 16 has the same flow of the heat exchange medium, and the heat exchange medium introduced through the inlet pipe 310 formed at the tube 100 of the first row passes through the tube 100 of the first row to reach the second header tank 220 and then discharged through the outlet pipe 320 along the tube 100 of the second row.

Therefore, the present invention may configure the inlet and outlet pipes 310 and 320 in the same direction to simplify the channel structure and reduce the space occupied within the vehicle, thereby easily disposing the surrounding components.

Meanwhile, as illustrated in FIGS. 3 and 13, when the tube 100 is formed in plural to be spaced apart from each other at a predetermined distance in the width direction thereof, the heat exchanger 1 for cooling an electric element according to the exemplary embodiment of the present invention includes a gap formed by allowing the tubes 100 to be spaced apart from each other in the width direction at a predetermined distance, in which the gap is formed to be at least twice as long as the length of the element fixing part 21 protruding at one side surface in the width direction of the electric element to prevent an interference from occurring between the element fixing parts 21 of the electric elements adjacently disposed to each other.

Further, in the heat exchanger 1 for cooling an electric element according to the exemplary embodiment of the present invention, a width Tw of the tube 100 may be equal to or smaller than a width Cw of the electric element so that the tube 100 may not cover pins protruding at both side surfaces of the electric element in the width direction of the electric element.

Figure 12:
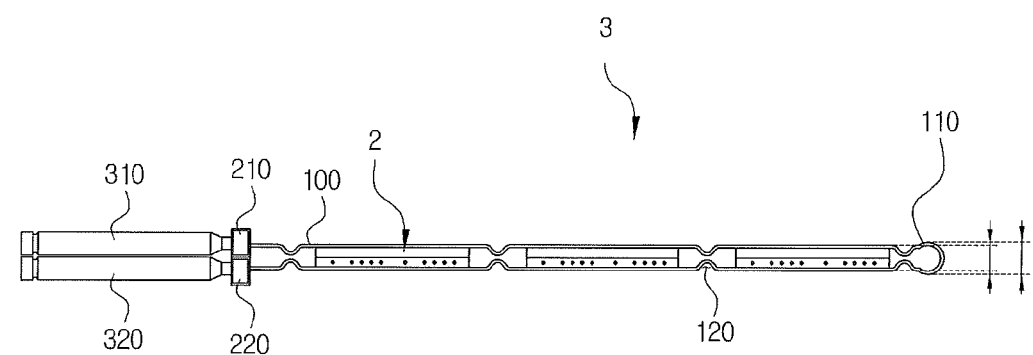
FIG. 12 is a side view illustrating a heat exchanger assembly for cooling an electric element according to another exemplary embodiment of the present invention.
Figure 20:
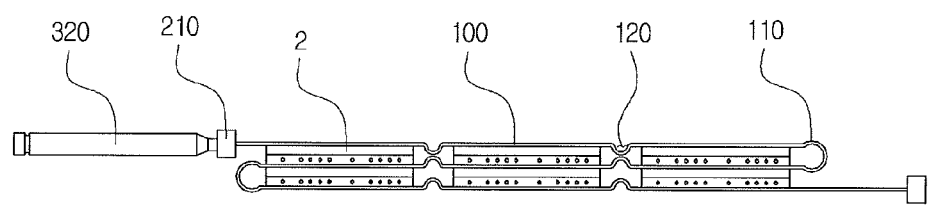
FIG. 20 is a side view illustrating the heat exchanger assembly for cooling an electric element according to another exemplary embodiment of the present invention.

According to another exemplary embodiment, as illustrated in FIGS. 12 and 20, the heat exchanger 1 for cooling an electric element according to the exemplary embodiment of the present invention may further include a clip coupling part 120 depressed by pressing a portion of the tubes 100 positioned at both end portions of the electric element 2 in the length direction of the electric element 2 to the electric element 2.

This is a structure of compressing the electric element 2 and the electric element 2 may be stably fixed between the tubes 100.

In addition, the heat exchanger 1 for cooling an electric element according to the exemplary embodiment of the present invention may further include a separate coupling member to completely bend the tube 100 and then press the tube so as to be compressed to the electric element 2, thereby stably fixing the electric element 2 between the tubes 100. Here, the means and the method may be variously changed without any limit.

Hereinafter, the heat exchanger assembly 3 for cooling an electric element will be described below.

Figure 8:
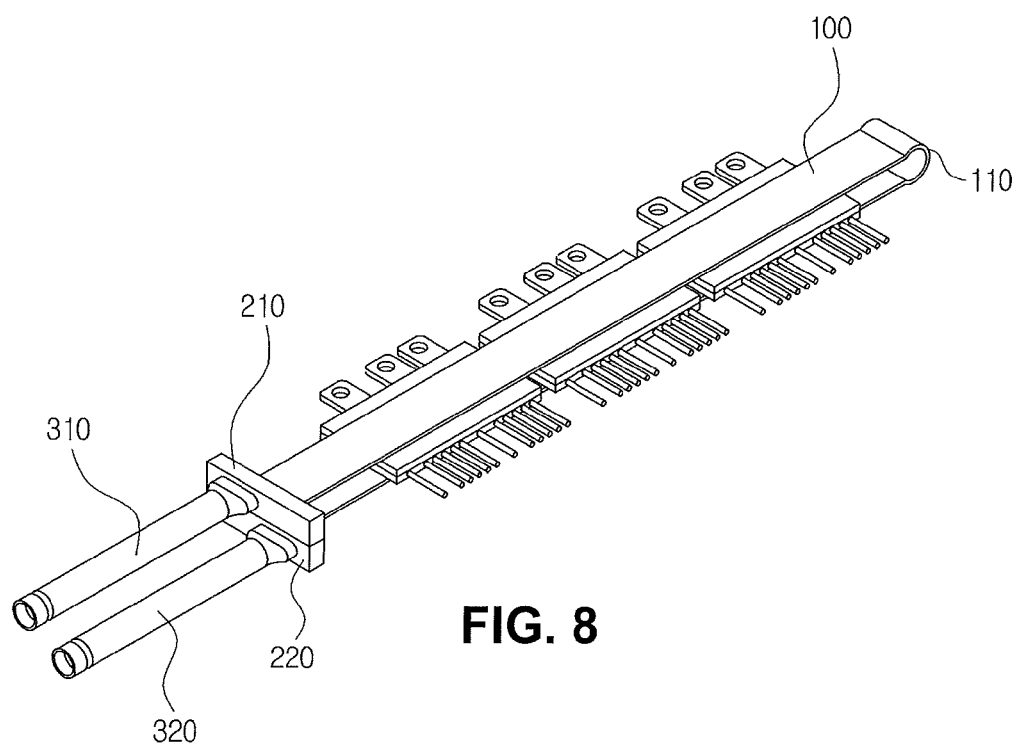
FIG. 8 is a perspective view illustrating a heat exchanger assembly for cooling an electric element according to an exemplary embodiment of the present invention.
Figure 9:
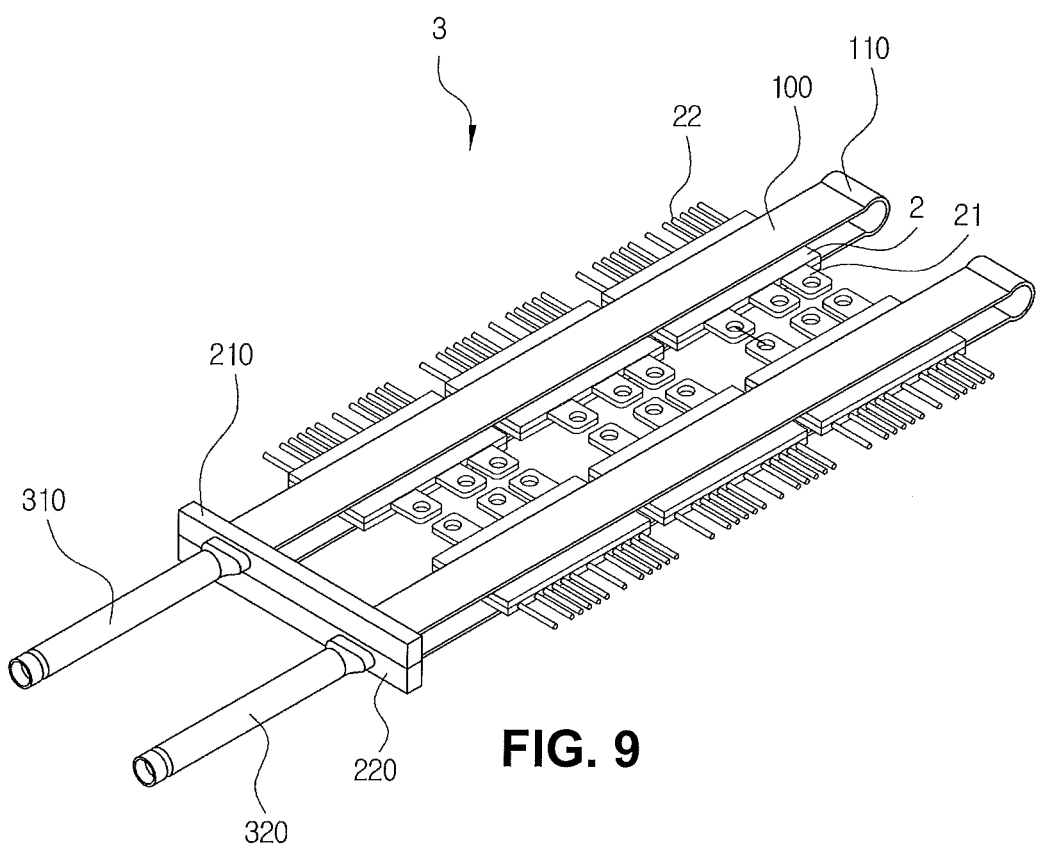
FIG. 9 is a perspective view illustrating a heat exchanger assembly for cooling an electric element according to another exemplary embodiment of the present invention.
Figure 10:
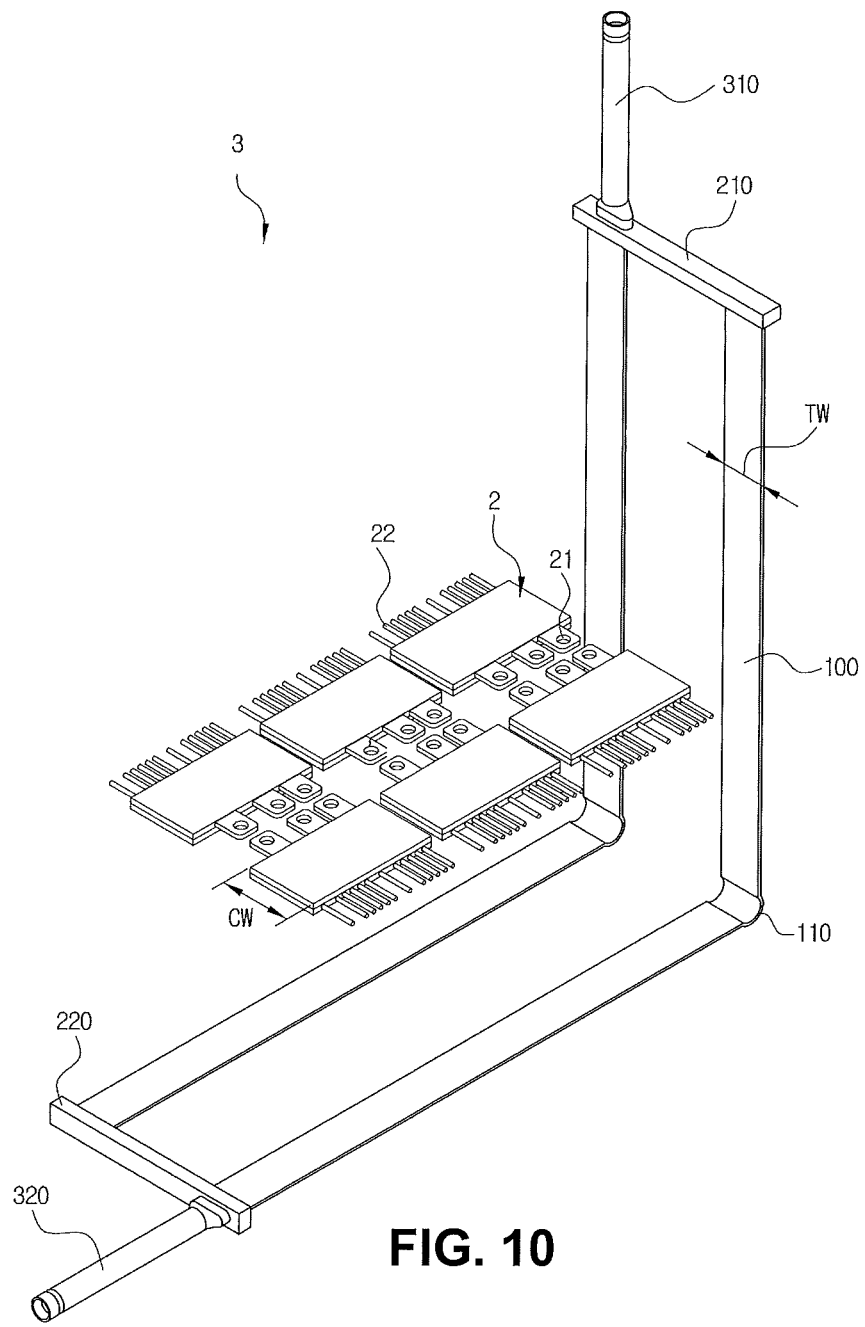
FIG. 10 is an exploded perspective view illustrating the heat exchanger assembly for cooling an electric element according to the exemplary embodiment of the present invention.
Figure 11:
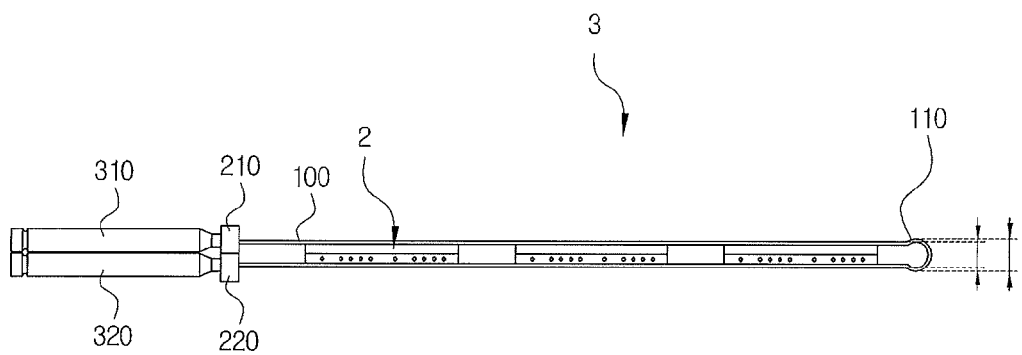
FIG. 11 is a side view illustrating the heat exchanger assembly for cooling an electric element according to the exemplary embodiment of the present invention.

As illustrated in FIGS. 8 and 9, the heat exchanger assembly 3 for cooling an electric element according to the exemplary embodiment of the present invention is formed by assembling the tube 100 of the heat exchanger 1 for cooling an electric element as described above with the electric element to contact the tube 100 to both side surfaces of the electric element in the height direction of the electric element.

In this case, in the heat exchanger assembly 3 for cooling an electric element according to the exemplary embodiment of the present invention, when the tube 100 is one row, the electric element is assembled by inserting the electric element between the tubes 100 so that connectors 22 of the electric element are disposed at one side surface of the tubes 100 in the width direction of the tubes 100 and the element fixing parts 21 of the electric element are disposed at the other side surface of the tubes 100 in the width direction of the tubes 100, thereby facilitating the assembling with a power supply unit or a substrate.

Figure 17:
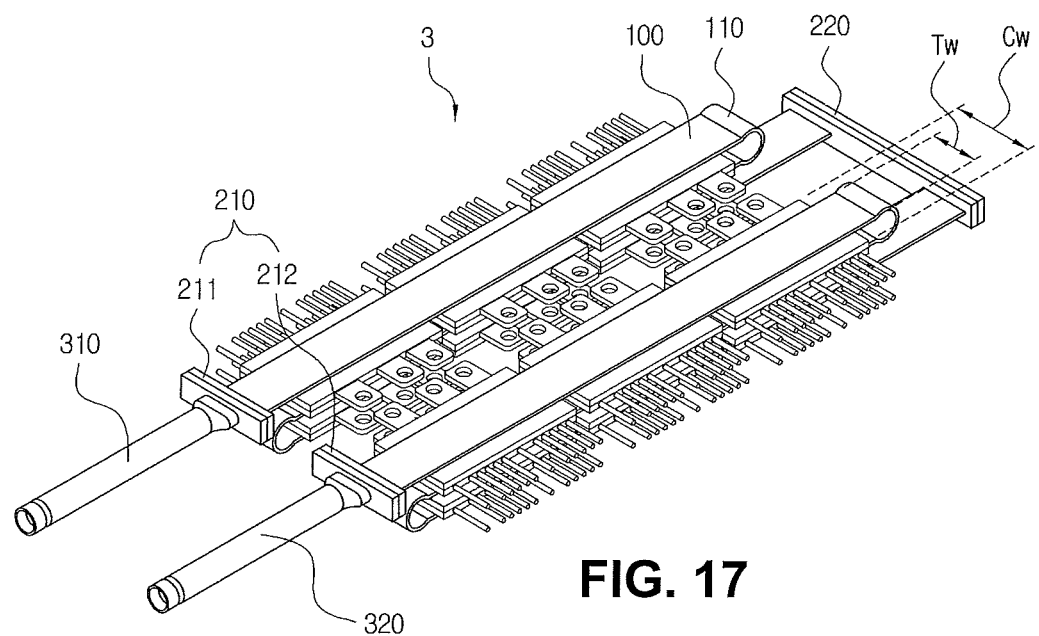
FIGS. 17 to 19 are a perspective view, an exploded perspective view, and a side view of the heat exchanger assembly for cooling an electric element in which the heat exchanger for cooling an electric element of FIG. 13 and the electric element are assembled.
Figure 18:
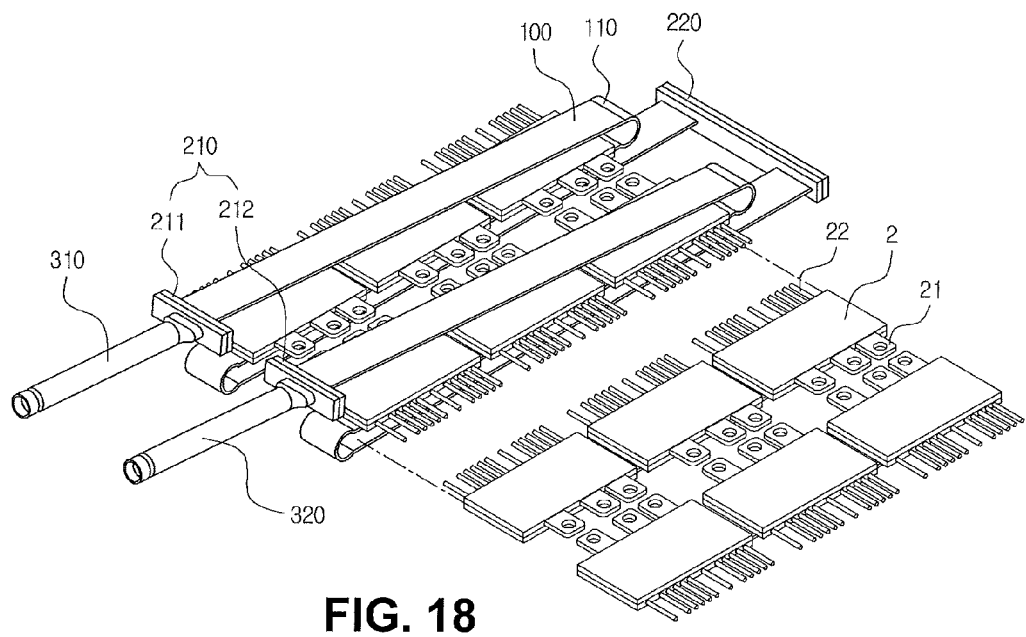
Figure 19:
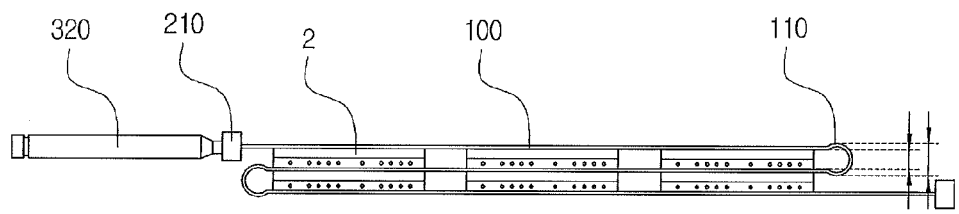

FIGS. 17 to 19 illustrate the heat exchanger assembly for cooling an electric element in which the heat exchanger for cooling an electric element of FIG. 13 and the electric element are assembled, in which the electric element 2 is assembled by inserting the electric element between the tubes 100 of the heat exchanger 1 for cooling an electric element.

Figure 6:
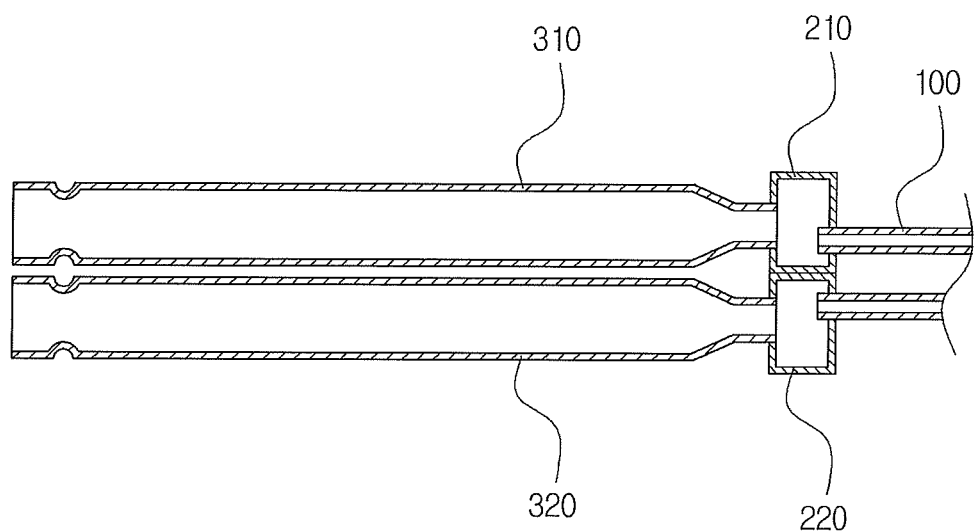
FIG. 6 is a cross-sectional view of an inlet pipe in the heat exchanger for cooling an electric element of FIG. 2 taken along direction a-a'.

As illustrated in FIG. 6, in the heat exchanger assembly 3 for cooling an electric element according to the exemplary embodiment of the present invention, when the tube 100 is bent at two points, the electric element 2 is disposed at a two-row two-stage and the number of stacked stages of the electric element 2 such as two-row three-stage and two-row four-stage may be controlled as needed in response to the bending frequency.

In the heat exchanger assembly 3 for cooling an electric element according to the exemplary embodiment of the present invention, when the tube 100 is two rows, the inside space formed by allowing the adjacent tubes 100 from being spaced apart from each other is provided with the element fixing part 21 of the electric element and the outside space thereof is provided with the connector 22 of the electric element, and as a result it is preferable to facilitate the connection of the power supply unit upon the assembling of the whole module.

Briefly describing the assembling process of the heat exchanger 1 for cooling an electric element according to the exemplary embodiment of the present invention, the heat exchanger 1 for cooling an electric element according to the exemplary embodiment of the present invention may be assembled by a scheme of inserting and fixing the electric element between the tubes 100 in the state in which the tube 100 is bent at an angle of about 5 to 10°, pressing the spaced interval, and compressing an upper surface of the electric element and the tube 100.

Therefore, the upper and lower side surfaces of the electric element may adhere to the tube 100 and the electric element may be assembled in the heat exchanger without a hard process of inserting an electric element into a narrow gap.

Further, the heat exchanger 1 for cooling an electric element according to the exemplary embodiment of the present invention may efficiently cool the heat generated from the integrated circuit element by contacting both side surfaces of the electric element and the tubes 100 in which the cooling water flows to each other.

The present invention is not limited to the above-mentioned embodiments but may be variously applied, and may be variously modified by those skilled in the art to which the present invention pertains without departing from the gist of the present invention claimed in the claims.

The invention claimed is:

1. A heat exchanger for cooling an electric element, the heat exchanger comprising: a first tube having a heat exchange medium flowing therein, the first tube including a first end, a second end, and a first predetermined bent point to cause the first tube to contact opposing surfaces of the electric element; a first header tank coupled to the first end of the first tube and configured to introduce the heat exchange medium to the first tube; a second header tank coupled to the second end of the first tube, wherein the electric element is compressed and fixed between the first end and the second end of the first tube when the first tube is bent about the first predetermined bent point to bring the first header tank into direct contact with the second header tank: and an inlet pipe coupled to the first header tank and configured to introduce the heat exchange medium to the first header tank.

2. The heat exchanger according to claim 1, further comprising an outlet pipe coupled to the second header tank, wherein the second header tank receives the heat exchange medium from the first tube and the outlet pipe is configured to discharge the heat exchange medium from the second header tank.

3. The heat exchanger according to claim 2, wherein the inlet pipe is coupled to the first header tank by brazing and the outlet pipe is coupled to the second header tank by brazing.

4. The heat exchanger according to claim 2, wherein the first header tank and the second header tank extend in parallel in a longitudinal direction, the first header tank including a first end aligned with a first end of the second header tank and a second end aligned with a second end of the second header tank.

5. The heat exchanger according to claim 4, wherein the inlet pipe is disposed adjacent the first end of the first header tank and the outlet pipe is disposed adjacent the second end of the second header tank, wherein a spacing of the inlet pipe from a center of the first header tank in the longitudinal direction thereof is equal to a spacing of the outlet pipe from a center of the second header tank in the longitudinal direction thereof.

6. The heat exchanger according to claim 2, further comprising a second tube having a first end coupled to the first header tank and a second end coupled to the second header tank, wherein the first end of the first tube and the first end of the second tube are spaced apart in opposite directions from a center of the first header tank in a longitudinal direction thereof and the second end of the first tube and the second end of the second tube are spaced apart in opposite directions from a center of the second header tank in a longitudinal direction thereof.

7. The heat exchanger according to claim 2, further comprising a second tube having a first end coupled to the first header tank and a second end coupled to the second header tank, wherein the first tube and the second tube are spaced apart from each other a predetermined distance in a width direction of the first tube and the second tube to form a gap therebetween.

8. The heat exchanger according to claim 7, wherein the electrical element includes an element fixing part protruding therefrom in a direction parallel to the width direction of the first tube and the second tube, wherein the gap formed between the first tube and the second tube is at least twice a distance the element fixing part protrudes from the electrical element.

9. The heat exchanger according to claim 1, wherein the first tube includes a rounded part formed at the first predetermined bent point, the rounded part having a diameter greater than a distance between the opposing surfaces of the electric element.

10. The heat exchanger according to claim 9, wherein a distance between the first end and the second end of the first tube is equal to the distance between the opposing surfaces of the electric element.

11. The heat exchanger according to claim 1, wherein the electrical element extends longitudinally in parallel with a longitudinal direction of the first tube.

12. The heat exchanger according to claim 11, wherein the electrical element includes a connector extending from a first side surface of the electrical element in a width direction of the first tube and an element fixing part extending from a second side surface of the electrical element in the width direction of the first tube, and wherein the first side surface is opposite the second side surface.

13. The heat exchanger according to claim 12, further comprising a second tube having a first end coupled to the second header tank, the second tube spaced apart from the first tube in a width direction of each of the first tube and the second tube to form a gap therebetween, wherein the element fixing part of the electrical element extends into the gap.

14. The heat exchanger according to claim 1, wherein a width of the first tube is less than or equal to a width of the electrical element.

15. A heat exchanger for cooling an electric element, the heat exchanger comprising:

a first tube having a heat exchange medium flowing therein, the first tube including a first end, a second end, and a first predetermined bent point to cause the first tube to contact opposing surfaces of the electric element;

a first header tank coupled to the first end of the first tube and configured to introduce the heat exchange medium to the first tube;

a second header tank coupled to the second end of the first tube;

an inlet pipe coupled to the first header tank and configured to introduce the heat exchange medium to the first header tank;

a second tube having a first end coupled to the second header tank and a first predetermined bent point, wherein each of the first tube and the second tube has a second predetermined bent point to cause each of the first tube and the second tube to have a zigzag shape; and a third header tank having an outlet pipe coupled thereto, wherein the second end of the second tube is coupled to the third header tank.

16. The heat exchanger according to claim 15, wherein the second header tank provides fluid communication between the first header tank and the third header tank.

17. A heat exchanger for cooling an electric element, the heat exchanger comprising:

a first tube having a heat exchange medium flowing therein, the first tube including a first end, a second end, and a first predetermined bent point to cause the first tube to contact opposing surfaces of the electric element;

a first header tank coupled to the first end of the first tube and configured to introduce the heat exchange medium to the first tube;

a second header tank coupled to the second end of the first tube; and an inlet pipe coupled to the first header tank and configured to introduce the heat exchange medium to the first header tank, wherein the electrical element extends longitudinally from a first end to a second end thereof, and wherein a clip coupling part is formed by deforming a first portion of the first tube toward the first end of the electrical element and by deforming a second portion of the first tube toward the second end of the electrical element.

18. The heat exchanger according to claim 15, wherein the first tube includes a first portion, a second portion, and a third portion, the first portion and the second portion separated by the first predetermined bent point and the second portion and the third portion separated by the second predetermined bent point, wherein the electrical element is in contact with the first portion and the second portion of the first tube and a second electrical element is in contact with the second portion and the third portion of the first tube.

* * * * *